United States Patent
Barker et al.

(10) Patent No.: US 7,510,124 B2
(45) Date of Patent: *Mar. 31, 2009

(54) WAFER IDENTIFICATION MARK

(75) Inventors: Brian Barker, Poughkeepsie, NY (US);
Raymond Bunkofske, South Burlington, VT (US); John Colt, Williston, VT (US);
Perry Hartswick, Millbrook, NY (US);
John Lewis, Colchester, VT (US);
Nancy Pascoe, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 211 days.

This patent is subject to a terminal disclaimer.

(21) Appl. No.: 11/164,117

(22) Filed: Nov. 10, 2005

(65) Prior Publication Data

US 2007/0241202 A1     Oct. 18, 2007

Related U.S. Application Data

(63) Continuation of application No. 09/527,761, filed on Mar. 17, 2000, now Pat. No. 7,007,855.

(51) Int. Cl.
*G06K 19/06* (2006.01)

(52) U.S. Cl. .................... 235/494; 257/797; 483/15

(58) Field of Classification Search ............... 235/494; 357/797; 483/15, 16, 401, 462, 975
See application file for complete search history.

(56) References Cited

U.S. PATENT DOCUMENTS

| 4,010,355 | A | 3/1977 | Roehrman et al. |
| 4,084,354 | A | 4/1978 | Grandia et al. |
| 4,256,514 | A | 3/1981 | Pogge |
| 4,418,467 | A | 12/1983 | Iwai |
| 4,585,931 | A | 4/1986 | Duncan et al. |
| 4,958,082 | A | 9/1990 | Makinouchi et al. |
| 5,060,043 | A | 10/1991 | Yasue |
| 5,175,425 | A | 12/1992 | Spratte et al. |
| 5,175,774 | A | 12/1992 | Truax et al. |
| 5,245,165 | A | 9/1993 | Zhang |
| 5,324,609 | A | 6/1994 | Yagi et al. |
| 5,329,090 | A | 7/1994 | Woelki et al. |
| 5,330,924 | A | 7/1994 | Huang et al. |
| 5,463,200 | A | 10/1995 | James et al. |
| 5,481,095 | A | 1/1996 | Mitsuda et al. |
| 5,521,709 | A | 5/1996 | Bossen et al. |
| 5,567,927 | A | 10/1996 | Kahn et al. |
| 5,639,387 | A | 6/1997 | Shahid |
| 5,792,566 | A | 8/1998 | Young et al. |
| 5,808,268 | A | 9/1998 | Balz et al. |
| 5,834,819 | A | 11/1998 | Wen |
| 5,864,130 | A | 1/1999 | Kahn et al. |

(Continued)

FOREIGN PATENT DOCUMENTS

JP     11-233389     8/1999

*Primary Examiner*—Seung H Lee
(74) *Attorney, Agent, or Firm*—Connolly Bove Lodge & Hutz LLP; Myron Keith Wyche; Anthony Canale (57) ABSTRACT

A semiconductor wafer including a plurality of pits in the semiconductor wafer. The pits are arranged in an information-providing pattern and are readable after completion of processing on the wafer.

60 Claims, 8 Drawing Sheets

U.S. PATENT DOCUMENTS

| | | |
|---|---|---|
| 5,894,348 A | 4/1999 | Bacchi et al. |
| 5,897,669 A | 4/1999 | Matsui |
| 5,907,144 A | 5/1999 | Poon et al. |
| 5,949,584 A | 9/1999 | White et al. |
| 5,976,768 A | 11/1999 | Brown et al. |
| 6,214,250 B1 | 4/2001 | Moh et al. |
| 6,268,641 B1 | 7/2001 | Yano et al. |
| 6,293,466 B1 | 9/2001 | Fujita et al. |

WAFER IDENTIFICATION MARK

CROSS REFERENCE TO RELATED APPLICATIONS

This application is a continuation under 35 U.S.C. §120 of U.S. application Ser. No. 09/527,761 filed on Mar. 17, 2000, the entire contents of which are incorporated herein by reference.

FIELD OF THE INVENTION

The present invention relates to information encoding structures on a semiconductor wafer and a method of encoding information on a semiconductor wafer. Also, the present invention relates to semiconductor wafers including information-encoding structures. Furthermore, the present invention also relates to a system for encoding information on a semiconductor wafer and reading the information.

BACKGROUND OF THE INVENTION

In semiconductor device manufacture, typically, a plurality of semiconductor dies, or chips, are cut from a larger piece of the semiconductor wafer. Along these lines, a plurality of silicon wafers typically is cut from a large boule of silicon.

After forming the semiconductor wafers, processing is carried out to form functional structures in and on the semiconductor wafers. Different processing may be carried out on each wafer. Additionally, different processing may be carried out on different parts of a single wafer.

SUMMARY OF THE INVENTION

The present invention provides a semiconductor wafer including a plurality of pits in the wafer. The pits are arranged in an information-providing pattern and are readable before, during and after completion of processing on the wafer.

Also, the present invention provides a system for encoding information on a semiconductor wafer and reading the information. The system includes a plurality of pits formed on the semiconductor wafer and an information-providing pattern and readable before, during and after completion of processing on the wafer. The system also includes means for reading the information encoded by the pits.

Furthermore, the present invention provides a method of encoding information on a semiconductor wafer. The method includes converting the information into a digital form and forming pits readable before, during and after completion of processing on the wafer corresponding to the digital form of the information in the semiconductor wafer.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized, the invention is capable of other and different embodiments, and its several details are capable of modifications in various obvious respects, without departing from the invention. Accordingly, the drawings and description are to be regarded as illustrative in nature and not as restrictive.

BRIEF DESCRIPTION OF THE DRAWINGS

The above-mentioned objects and advantages of the present invention will be more clearly understood when considered in conjunction with the accompanying drawings, in which.

DETAILED DESCRIPTION

As discussed above, a plurality of semiconductor wafers may be cut from a larger piece of the semiconductor. Along these lines, a plurality of wafers of silicon may be cut from an elongated boule of silicon. Processing is then carried out on the silicon wafers. It may be desirable to track the processing of the wafers.

As semiconductor wafers are processed, typically the wafers are processed according to different schemes forming different structures on a plurality of different wafers. Additionally, different structures may be formed on different parts of a single wafer. It may also be desirable to be able to identify the processing recipes being used on a wafer as the wafer throughout wafer processing.

Currently, semiconductor wafers are identified by bar codes. Typically, a laser is utilized to create a bar code on semiconductor wafers to identify the semiconductor wafers. However, a laser scribed bar code typically cannot be read after process steps. In the past, to improve the readability of a laser scribed bar code, a rectangle has been implanted before scribing to improve the contrast. The bar code may then scribed on the implanted rectangle. When the bar code becomes unreadable, a special reader has been required to read the bar code. This permits a tool reader to read the bar code.

As an alternative to imprinting a bar code on an implanted region, materials have been deposited in and on the wafers to change the contrast of the wafer relative to the bar code. However, such deposited films are attacked during subsequent processing.

Typically, multiple manufacturing tools run wafer lots of multiple product design and multiple engineering change (EC) levels, or versions of specific products. Lot numbers on a transport box may control the wafer lots. It often is important to track wafers to ensure the correct wafer receives the correct process. Tracking may be carried out with the bar code described above. However, as stated above, the bar code may become unreadable. Additionally, current semiconductor fabrication control systems require a data system that identifies wafers and lots and downloads the proper tool recipes. In many cases different wafers within a lot may require different processing. This is also based on lot and wafer identity. The correctly identifying routing and processing wafers is very important. Correctly identifying routing and tool recipe is very important for successful semiconductor fabrication.

Future processing advances include 300 millimeter or larger wafer fabricators. As such fabricators come online, it is expected that multiple part numbers will exist within wafer lots. This will further complicate control requirements. Along these lines, even more importance will be placed on wafer tracking systems.

The present invention provides solutions to the above and other problems. Along these lines, the problems that the present invention seeks to address include loss of whole customer orders. The present invention provides a scheme for permitting a wafer to be identified. Identification of the wafer can permit determination of the structures formed thereon.

Additionally, the present invention can provide a reliable method for identifying wafers during fabrication and permitting quick matching of a wafer to a lot, a wafer to a process tool and/or a process recipe, among other things. The present invention is more reliable than currently utilized bar code systems.

The present invention can also provide a reliable method of controlling wafers during fabrication permitting tracking of a wafer to a lot, wafer to a process, and a wafer to a process recipe, among other things. The present invention may also reduce tool and logistical control system expenses by moving certain control functions to a local level. Again, the present invention may carry out these functions with greater reliability than currently utilized bar code systems.

The present invention addresses shortcomings of currently utilized wafer processing systems by providing a system that can survive wafer processing to be readable by human eyes, whether assisted or not, or by machine. The present invention also provides methods that can provide several orders of magnitude increase in the amount of information available on a wafer as compared to a common or standard bar code. The information provided on semiconductor wafers according to the present invention could further be utilized to locally control tools in addition to providing wafer identification data.

The present invention can be utilized to accomplish a variety of different goals. For example, the present invention can permit determination of position of a wafer in a boule as well as the identification of a wafer for the purposes for determining the structures formed thereon. Also, the present invention can permit identification the position of one wafer in a boule relative to other wafers cut from the same boule. The present invention can also permit tracking and routing of semiconductor wafers and manufacturing processes. Any other use for information encoded on a semiconductor wafer may also be carried out according to the present invention.

In general, the present invention provides techniques for encoding any desired information on a semiconductor wafer. The present invention provides structures for encoding information on a semiconductor wafer as well as a method for forming the structures and for retrieving the information encoded in the structures. Any information may be encoded in the structures.

In general, information-encoding structures on a semiconductor wafer according to the present invention include a plurality of information-encoding pits in the semiconductor wafer. The pits may be formed in any part of the semiconductor wafer. In other words, the pits may be formed on a top surface of the semiconductor wafer, on a bottom surface of the semiconductor wafer, and/or on side surfaces of the semiconductor wafer. The pits are arranged in an information-providing pattern and are readable after completion of processing on the wafer. As described below, any number of patterns may be utilized according to the present invention.

Arrangements of the information-providing pattern of the pits according to the present invention can include a bar code, digital pattern, alphanumeric pattern, and/or any other desired pattern. If the pits are arranged in a digital pattern, the pattern could comprise pits having two different lengths. The pits could be provided on any surface of the semiconductor wafer. Along these lines, the pits could be provided on a front surface, back surface and/or side surface such as the edge, of the semiconductor wafer.

Pits according to the present invention could be readable in one or more ways. For example, the pits could be readable to the naked human eye. The pits could also be readable by a reading device. Along these lines, a laser-reading device could be utilized to read information encoded in pits according to the present invention. The pits could be machine-readable.

Pits according to the present invention could be formed in any one or more of a variety of shapes, sizes, and arrangements relative to each other. Along these lines, each pit could be formed having the same or different shapes and/or depths. For example, all of the pits could have a general circular shape. All the pits could also have a square, generally square, rectangular and/or any other shape. The pits may also be formed such that all of the pits do not have the same shape.

As stated above, binary information could be encoded in pits having two different shapes. Binary information could also encoded in pits all having the same shape with the lack of a pit forming the second value in the binary information.

If the pits do not all have the same shape, they could have different widths and/or lengths, such as where the pits are rectangles having different lengths, as well as where the pits have different overall shapes. Typically, the pits would have at least two different widths, lengths, or shapes. In some cases, all of the pits have the same length but different widths or the same width and different lengths.

As stated above, different embodiments of the pits may have different dimensions. Typically, the pits have a width of at most 1 millimeter. The dimensions of the pits may depend at least in part upon where the pits are formed. Pits formed in edge of the semiconductor wafer may have much greater dimensions than pits formed on a front or back surface of a semiconductor wafer.

Similarly, the depth of the pits may depend upon where they are formed. Pits formed on edge of a semiconductor wafer may be formed a much greater distance into the material of the semiconductor wafer than pits formed on a front or back surface of the semiconductor wafer. Pits formed on a front or back surface of a semiconductor wafer may be formed a depth of at least about 2.5 µm into the material of the semiconductor wafer.

As with the other dimensions, the spacing between pits may vary depending upon the embodiment. According to one embodiment, pits are separated from each other by distance of about 2 millimeters. Typically this is the case for pits formed in an edge of a semiconductor wafer. Pits formed in front or back surface of the semiconductor wafer may be arranged much closer to each other. Along these lines, the pits may be formed separated from adjacent pits by a distance by about 5 µm to about 10 µm. According to one embodiment, a distance of at least about 5 µm separates adjacent pits in a line or adjacent lines from each other.

The contour of sidewalls of the pits may also vary. Typically, at least a portion of the sidewalls of pits according to the present invention are straight and perpendicular to the top surface, bottom surface and/or edge of a semiconductor wafer that the pits are formed in.

Edges of pits according to the present invention, where the sidewalls of the pits meet the surface of the semiconductor wafer or where the bottom surface of a pit meets the sidewalls of a pit may be curved rather than forming a sharp point. Therefore, at least a portion of the sidewalls and/or bottom wall of the pits may be curved. In fact, the entire bottom surface and/or side walls of a pit according to the present invention may be curved. Furthermore, at least one of the pits may be angled with respect to a line perpendicular to a top surface or a bottom surface of a semiconductor wafer.

Pits according to the present invention, typically are formed in groups. The provision of pits in a group may facilitate their reading. Additionally, the pits may be formed in groups to permit them to represent information readable to the naked eye of the reader. Along these lines, the pits may be formed in groups having a shape of alphanumeric characters. According to such an embodiment, a group of pits forming a letter and/or number could have dimensions of about 2 mm by about 5 mm. Such groupings of pits could also include machine-readable portions as discussed above.

Readability of pits according to the present invention may be provided in a number of different ways. Along these lines, the pits may be detected because light or other radiation striking the pits is not reflected. Alternatively, light or other radiation striking the pits may be reflected with a phase change. According to one embodiment, light or radiation striking spaces between the pits forms interference fringes, making the pits readable.

The pits may also be readable due to a contrast between the pits and the surface of the semiconductor wafer surrounding at least portions of the pits. Processing regions of the substrate where pits are to be formed may provide this contrast. Along these lines, contrast could be provided by ion implanting in the region where the pits to be formed. The ion implant may be carried out to a depth wherein the pits have a greater depth than the depth of the ion implant. Alternatively, the pits simply having sufficient depth could provide the contrast. Contrast could also be provided according to any other desired method.

After formation of the pits, a coating could be provided on a surface of the semiconductor wafer including the pits. Any desired coating could be utilized. According to one embodiment, the coating is sapphire according to another embodiment the coating is silicon carbide. According to other embodiments, silicon dioxide/sapphire, polyimide and others materials may be utilized, depending at least in part upon what the process steps are carried our after the coating.

In addition to being arranged in groups forming alphanumeric characters, pits according to the present invention could be arranged in other groupings. Along these lines, the pits could simply be arranged in at least one line. Groups of pits may be arranged variously relative to other groups of pits on a semiconductor wafer.

The pits according to the present invention could also include at least one pit for providing location reference to a plurality of information-encoding pits. Then, at least one information-encoding pit could be arranged anywhere on the semiconductor wafer. It is important that the location of the information-encoding pits relative to the reference pit(s) is known to permit the location of the information encoding pits to be determined and properly read. The reference pit(s) could be arranged in any surface of the semiconductor wafer, regardless of where the information-encoding pits are located. For example, the reference pit(s) could be provided in an edge of the semiconductor wafer while the information encoding pits are arranged in an upper or lower surface of the semiconductor wafer.

The present invention also provides a method of encoding information on a semiconductor wafer including conversion of the information into a digital form and forming pits corresponding to the digital form of the information in the semiconductor wafer. The pits may be as described above. The method could also include forming at least one reference pit as described above. Furthermore, the method can include providing the pits with a detectable contrast with respect to surrounding portions of the semiconductor wafer. According to one embodiment, a method of encoding information according to the present invention can include forming a curved groove in a boule of semiconductor material forming at least one linear group in the boule and slicing the boule into wafers.

The following describes three particular embodiments of the present invention. The examples described below are illustrative and not exhaustive. As such, those of ordinary skill in the art would be able to develop alternatives to aspects of the embodiments described below as well as entirely different embodiments without undue experimentation once aware of the disclosure contained herein.

Figure 1:
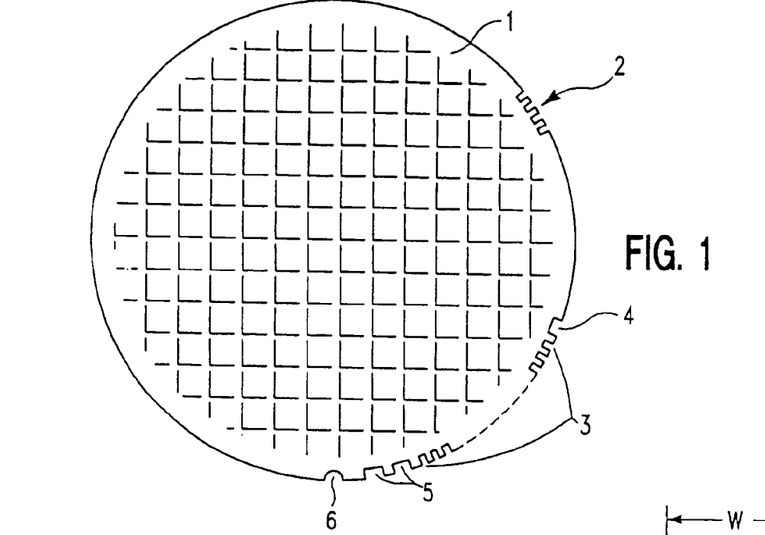
FIG. 1 represents an overhead view of an embodiment of a semiconductor wafer according to the present invention.

While pits may be formed in semiconductor wafers at a plurality of stages during the processing of the semiconductor wafers, according to one embodiment of the present invention, pits may be formed in the semiconductor prior to its existence as a wafer. Along these lines, pits may be formed in a semiconductor boule prior to slicing the boule into wafers. FIG. 1 illustrates a wafer that may be formed according to such a process. Of course, rather than forming such pits in the boule, the pits could be cut in each wafer individually.

As described above, FIG. 1 represents an embodiment of the present invention wherein pits have been formed in the side of the semiconductor wafer. While the pits illustrated in FIG. 1 may be cut and each individual wafer, typically such pits would be formed in the boule of silicon prior to slicing the boule into wafers. Along these lines, FIG. 3 illustrates a boule of silicon 10 wherein the pits comprises a plurality of notches formed in the boule.

Figure 3:
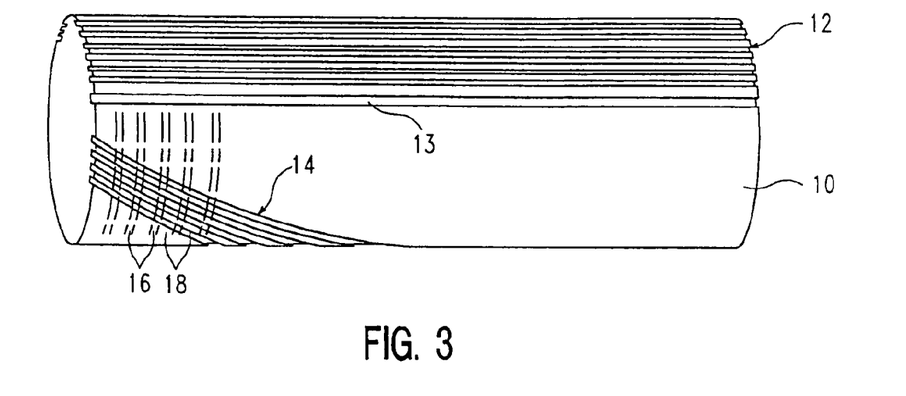
FIG. 3 represents a perspective view of a silicon boule including an embodiment of pits according to the present invention.

The boule illustrated in FIG. 3 includes two different types of pits or notches. Along these lines, the boule 10 includes linear wafer identification notches 12 and curved boule sequence notches 14.

The wafer identification notches can provide standard identification data identifying the wafer. This identification may be matched with a specific process or customer or other information in a computer used to control processing. Boule sequence notches can help to identify where a wafer came from in a boule particularly relative to other wafers in the boules. The identification notches could be utilized for boule identification, manufacture code, doping and/or crystal orientation, among other pieces of information. The information may also include wafer parentage information, such as raw wafer type (i.e. SOI), intended user (to prevent hijacking of completed wafers since packaging is not always done in the same location as manufacture), critical process information for down stream (i.e. copper), and critical measurements, which may alter later process input during process.

The notches 12 and 14 may be formed in the boule according to any desired process. Along these lines, they could be machined by physically cutting the boule with a tool. Alternatively, the notices could be cut with a laser. Any other suitable process may also be utilized.

The wafer identification notches 12 may be formed by simply cutting a linear notch straight along the boule. On the other hand, simultaneously turning the boule and laterally altering the position of the boule relative to a cutting tool may form the embodiment of the boule sequence notches shown in FIG. 3. Such movement of the boule and/or cutting tool would result in the cutting of boule sequence notches in a slow spiral around the circumference of the boule, similar to the machining of a screw thread.

After forming notches in the boule, the boule may be sliced into individual wafers. Along these lines, FIG. 3 illustrates the saw kerf 16 as well as individual wafer slices 18. After slicing the wafers, the wafers may be polished.

As is evident from FIG. 3, the beginning of the set of wafer identification notches 12 which may be identified as a wafer sequence start notch 13. If the boule sequence notches are formed in a curve on the boule, the wafer identification notches will be a different distance from the boule sequence notches 14 for each wafer sliced from the boule. To facilitate identification of the beginning of the wafer identification notches, the wafer sequence start notch may have double the width of the other wafer identification notches. The same may be true of the wafer identification notch at the opposite side of the set of wafer identification notches from the wafer sequence start notch.

FIG. 1 illustrates an example of an embodiment of a semiconductor wafer that includes notches formed in the side of the semiconductor wafer. The notches in the semiconductor wafer illustrated in FIG. 1 have been formed as illustrated in FIG. 3. Therefore, the wafer 1 includes boule sequence notches 2 and wafer identification notches 3. While the wafer 1 includes four boule sequence notches, any number of boule sequence notches may be included. Along these lines, the wafer need include only one boule sequence notch. As described above, the wafer identification notches may include a wafer sequence start notch. 4. As also described above, the start notch 4 may be the notch closest to the boule sequence notches.

The embodiment of the semiconductor wafer illustrated in FIG. 1 also includes read start notches 5 formed at the end of the series of identification notches opposite the end that includes the wafer sequence start notch. The read start notches and wafer sequence start notches may be used to calibrate a notch reader that reads the sequence of notches and translates the notches into the information encoded therein.

Similar to the wafer sequence start notch, the read start notches may have double the width of the identification notches. This may help to facilitate reading of the identification notches. However, in some embodiments, the read start notches and wafer sequence start notches may have a diameter of the same or small than the diameter of the identification notches. Simply detecting the difference in the wafer notch may permit identification of the location of the beginning of the identification notch sequence.

A semiconductor wafer such as that illustrated in FIG. 1 may also include a notch 6 for alignment of the semiconductor wafer on a wafer chuck. Such reference position notches are typically utilized on semiconductor wafers to permit standard positioning of wafers on a processing chuck. Those of ordinary skill in the art are familiar with such reference position notches. Therefore, they will not be discussed here in any greater detail.

Figures 1A, 2:
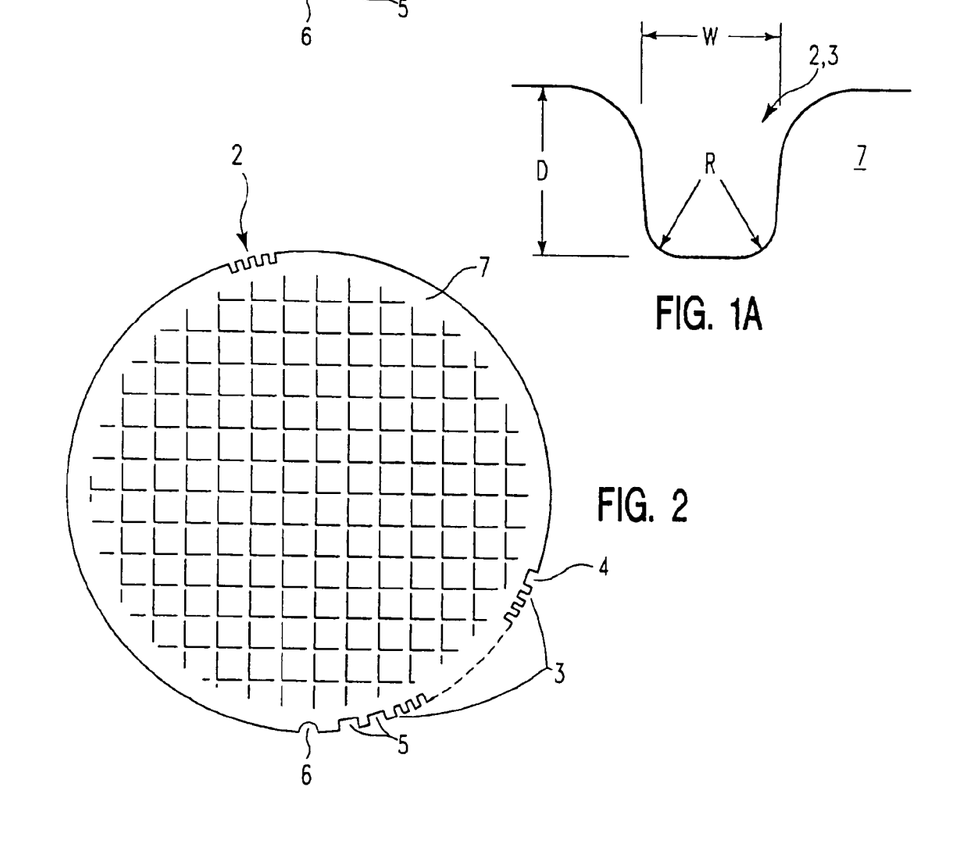
FIG. 1a represents a cross-sectional view of an embodiment of a pit that may be formed in a semiconductor wafer according to the present invention.
FIG. 2 represents an overhead view of another embodiment of a semiconductor wafer according to the present invention.

The identification notches or pits 3 provided in the side of semiconductor wafer 1 illustrated in FIG. 1 may be formed with any desired width and depth. FIG. 1a illustrates a close up view of one notch 7. The notch 7 has a width W in the plane of the semiconductor wafer and a depth D that the notch or pit 7 extends from the edge of the semiconductor wafer toward the center of the semiconductor wafer.

The width of the notches may be about 0.1 mm to about 1.5 mm, while the depth may be about 0.2 mm to about 1.0 mm. Typically, notches such as those in the embodiment of the present invention illustrated in FIG. 1 have a width of about 1 mm or less and a depth of about 1 mm or less. The width and depth may also be smaller and in some cases much smaller than 1 mm.

To help prevent stress cracking of a semiconductor wafer in the vicinity of the notches, the corners of the notches may be rounded rather than having the sides and bottom of the wafer as illustrated in FIG. 1a meet at a sharp corner. Typically, the radius can be approximately 10% of the width of the notch, or sufficient to round the edge to reduce fractures.

Of course, the notch illustrated in FIG. 1a and the dimensions described above represent one embodiment of notches or pits that may be formed in the edge of a semiconductor wafer according to the present invention. Other shapes and dimensions may be possible. Those of ordinary skill in the art would be able to determine such alternative shapes, dimensions and other parameters for such pits or notches once aware of the disclosure contained herein.

Information is encoded in a wafer such as that illustrated in FIG. 1 simply as binary data. In other words, the presence of a notch may be considered to have a value 1. On the other hand, the absence of a notch may be assigned a value of 0. Of course, the values of the notch and the absence of a notch may be reversed. The absence of a notch is also a space between notch positions. Furthermore, two different size notches could represent the two values in a binary encoding system.

The groups of notches illustrated in FIG. 1 may be utilized to encode identification information for a semiconductor wafer. This information may include standard identification data. Examples of such data are provided above.

FIG. 2 represents an embodiment of a semiconductor wafer cut from the same boule that the wafer illustrated in FIG. 1 was cut from. Therefore, the wafer 7 illustrated in FIG. 2 includes boule sequence notches 2, wafer sequence start notch 4, wafer identification notches 3, read start notches 5 and reference position notch 6. However, as FIG. 2 illustrates, the boule sequence notches are shifted in position relative to the other notches on the wafer. This can result from the formation of the boule sequence notches as illustrated in FIG. 3. This shifting of the boule sequence notches can permit identification of where a wafer was cut in a boule as well as its position in a boule relative to other wafers.

Cutting boule sequence notches in a semiconductor wafer as illustrated in FIG. 3, may permit identification of any number of wafers in a boule. According to one example, 1000 wafers can be identified in a boule having a length of 1.5 m. In fact the number of wafers is practically infinite because the pattern of the notches may be changed as one moves along the boule. According to this embodiment, the wafers have a width of about 200 mm and, therefore, a circumference of about 628 mm. If four boule sequence notches are utilized, in each of these boule sequence notches has a width of about 1 mm and are spaced about 0.25 mm apart. In this embodiment, 600 millimeters of the circumference of the boule is utilized for boule sequence notches. One advantage of this technique is that the wafer identification is encoded in two ways, the pattern of the notches and their angular displacement from a specified starting point.

Utilizing 400 millimeters about the circumference of the boule sequence notches leaves about 228 millimeters for wafer identification notches. One identification notch group of 30 notches read as a single number would give over 250 million different numbers. Additionally, 120 identification notches read in groups of six notches would give twenty 64 digit numbers. Such an embodiment would conveniently translatable to alphanumeric characters with combinations to spare.

Of course, the spacing of the boule sequence notches, number of boule sequence notches, number grouping and identification of wafer identification notches may be varied. Those of ordinary skill in the art would be able to determine any number of combinations of notch size, spacing, grouping and other parameters without undue experimentation once aware of the disclosure contained herein.

Once information is encoded on a semiconductor wafer as is shown in FIGS. 1 and 2, the information may be read. With notches such as those illustrated in FIGS. 1 and 2, as described above, information is encoded in a binary manner. As information is read, it produces two values.

Figure 4:
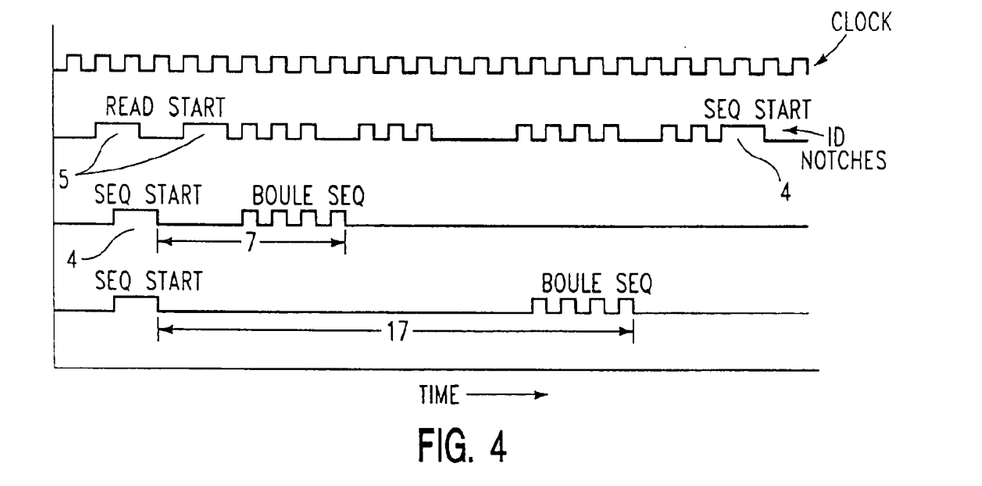
FIG. 4 represents electronic signals that may be produced during reading of patterns of information encoding pits that may be formed in a semiconductor wafer according to the present invention.

FIG. 4 illustrates an embodiment of a representation of a signal that a reader would pick up and analyze when reading the notches. In the embodiment illustrated in FIG. 4, the vertical axis represents voltage or current, while the horizontal axis represents time. According to other embodiments, the vertical axis could represent a different variable, where a variable other than voltage or current is measured as the notches are read.

Figure 4A:
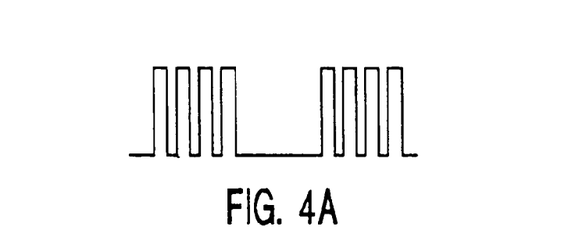
FIG. 4a represents a close-up cross-sectional view of another embodiment of an electronic signal that may be produced during reading of patterns of information encoding pits that may be formed in a semiconductor wafer according to the present invention.

In FIG. 4, the top signal line, identified as CLK, can be a clock signal internal to reader electronics. As illustrated in FIG. 4a, the clock signal could be comprised of smaller pulses to increase timing accuracy and other purposes discussed below. The clock signal can be used to time the reading of the notches.

As the identification notches pass under the reader, the ID notch signal illustrated in FIG. 4 may be produced. Both the wafer illustrated in FIG. 1 and the wafer illustrated in FIG. 2 produce the ID notch signal illustrated in FIG. 4. As shown in FIGS. 1 and 2, the two read start notches 5 having a double width are at the beginning of the ID notch sequence. Then, the identification notches 3, followed by the wafer sequence start notch 4. After reading the wafer sequence start notch 4, the reader will read the boule sequence notches.

After reading the double wide read sequence start notches, a reader could introduce an offset to align the ID notches signal edges up with the clock signal edges in the clock signal illustrated at the top of FIG. 4. The information contained between the read start and the sequence start notches may be compared to a clock signal and a binary data string produced.

The same steps utilized to decode the wafer identification notches 3 may be utilized to decode boule sequence notches. As illustrated in the two last two lines illustrated in FIG. 4, corresponding to the wafers illustrated in FIGS. 1 and 2, the boule sequence notches as illustrated in FIG. 1 are much closer to the sequence start notch 4 as compared to the distance of the boule sequence notches on the wafer illustrated in FIG. 2 from the sequence start notch 4. Along these lines, the boule sequence notches and wafer illustrated in FIG. 1 are seven clock pulses from the sequence start pulse. On the other hand, the boule sequence notches and the wafer illustrated in FIG. 2 are 17 clock pulses from the sequence start pulse. Of course, wafers may be cut from other locations in the boule and boule sequence notches could be located at any number of clock pulses from the start pulse, depending upon where in the boule of the wafer is cut from.

Since wafers may be missing from boules and the boule sequence notches may not be spaced in exact integer multiples of the notch width/spacing from the sequence start notch, the edges of the boule sequence notches typically need to be matched to the smaller pulses within the clock signal and the timing offset by a fractional amount to the nearest whole integer pulse. It may be useful to perform this operation once when notches are introduced into a fabricator and to store fractional offsets resulting therefrom combined with the ID notches signal as the wafer fingerprint.

Figure 5:
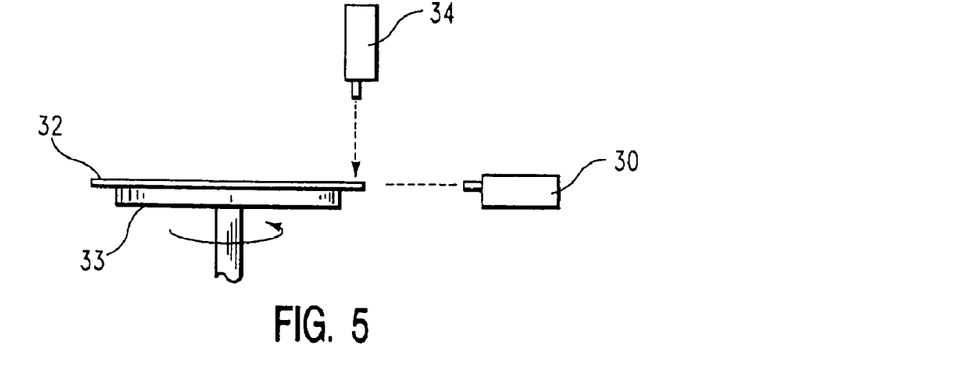
FIG. 5 represents a side view of an embodiment of a system for reading information encoded in pits in a semiconductor wafer according to the present invention.
Figure 6:
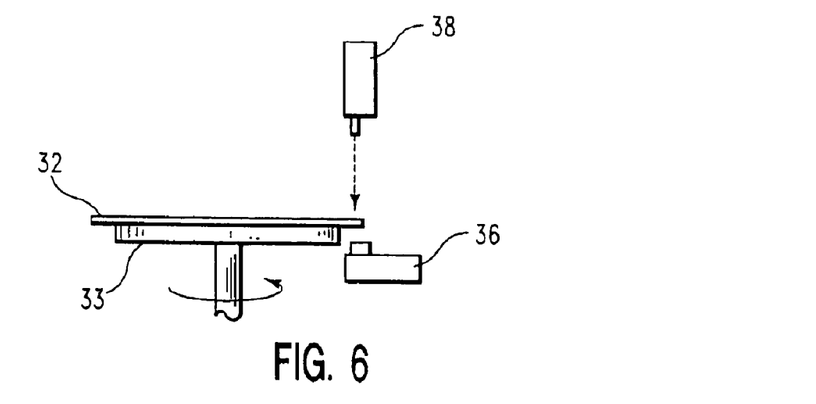
FIG. 6 represents a side view of another embodiment of a system for reading information encoded in pits in a semiconductor wafer according to the present invention.

Wafers such as those illustrated in FIG. 1 and FIG. 2 may be read according to any number of suitable techniques. FIGS. 5 and 6 illustrate two different systems that may be utilized for reading information encoding pits in a semiconductor wafer according to the present invention. Along these lines, FIG. 5 illustrates an embodiment of a reader for reading wafer notches that includes two laser interferometers. On the other hand, the embodiment illustrated in FIG. 6 includes a laser or other radiation source and a linear diode array.

The embodiment of a notch reader illustrated in FIG. 5 includes a laser interferometer 30 pointed toward the side of the wafer 32 supported by wafer chuck 33. The interferometer produces a laser beam that is directed toward the wafer. The laser beam bounces off the rotating wafer 32. A delay in time from the edge wafer to the bottom of a notch is measured and turned into a pulsed signal. Signal averaging may be utilized to resolve offset in wafer rotation and differences in reflectivity along the edge.

By placing an interferometer 34 pointed toward the top surface of the semiconductor wafer, many potential variations in signal can be avoided. This can result from the lack of return signal when a notch is present. Whether interferometer 30 or interferometer 34 is included in a reader according to the present invention, signal conditioning is typically is required to produce clean, evenly spaced pulse signals for decode circuits.

FIG. 6 illustrates another embodiment of a reader according to the present invention for reading embodiments of semiconductor wafers such as those shown in FIGS. 1 and 2. The embodiment of a reader illustrated in FIG. 6 includes a linear diode array 36 as a detector. The embodiment illustrated in FIG. 6 can be significantly less expensive than utilizing an interferometer. A laser/light source 38 is located above the top surface of the wafer to direct light toward the wafer.

Figure 7:
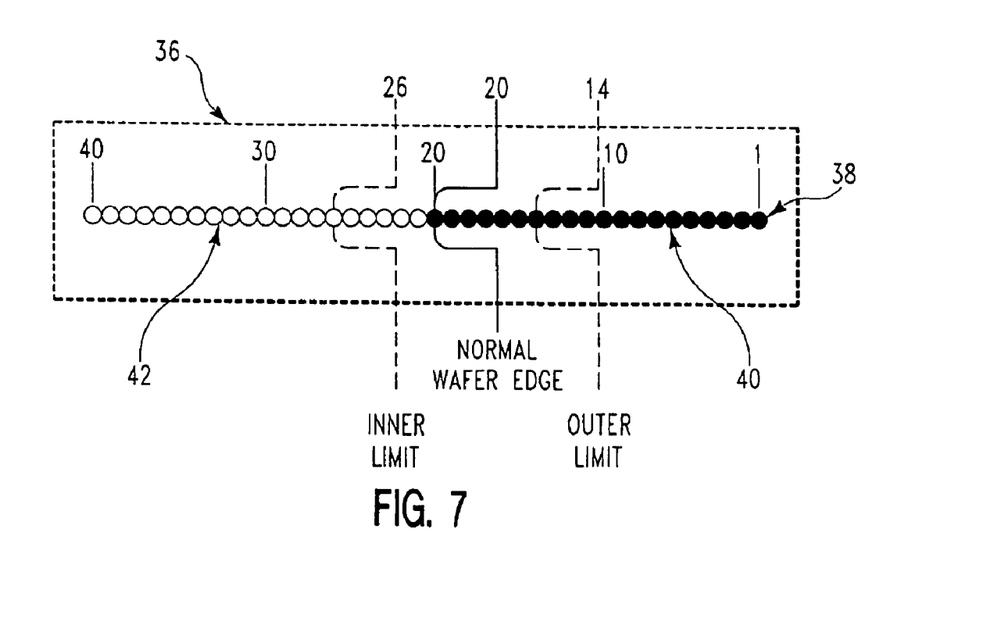
FIG. 7 represents a view of current flow in diodes according to a system for reading information encoded in pits in a semiconductor wafer according to the present invention.

FIG. 7 illustrates how the light/laser could cause current flow in some diodes indicated as "on" diodes and not in others, indicated as "off" diodes. This method may be very insensitive to non-centered rotation and damaged edges as a maximum and minimum limit can be set up. In this embodiment, at least 14 diodes typically are illuminated, but no more than 26, to distinguish the alignment notch, for example.

The embodiment of the linear diode array 36 illustrated in FIG. 7 includes 40 diodes 38. In FIG. 7, "on" diodes are indicated as 40 and "off" diodes as 42. The diode array illustrated in FIG. 7 includes an outer limit for where the edge of the wafer and notches may be located relative to the diodes and an inner limit. A nominal wafer edge is also indicated in FIG. 7.

According to another embodiment of the present invention, rather than forming pits in an edge of a semiconductor wafer, pits may be formed in the top surface and/or the bottom surface of the wafer. Similar to the embodiment illustrated in FIGS. 1 and 2, the pits formed in a top or bottom surface of the semiconductor wafer according to this embodiment may also be read by detecting the presence or lack thereof of pits or the presence of pits having different forms. The pits formed in an upper and lower surface of the semiconductor wafer may be formed in pattern that may not only be read by machine but also by the naked eye.

Figure 8:
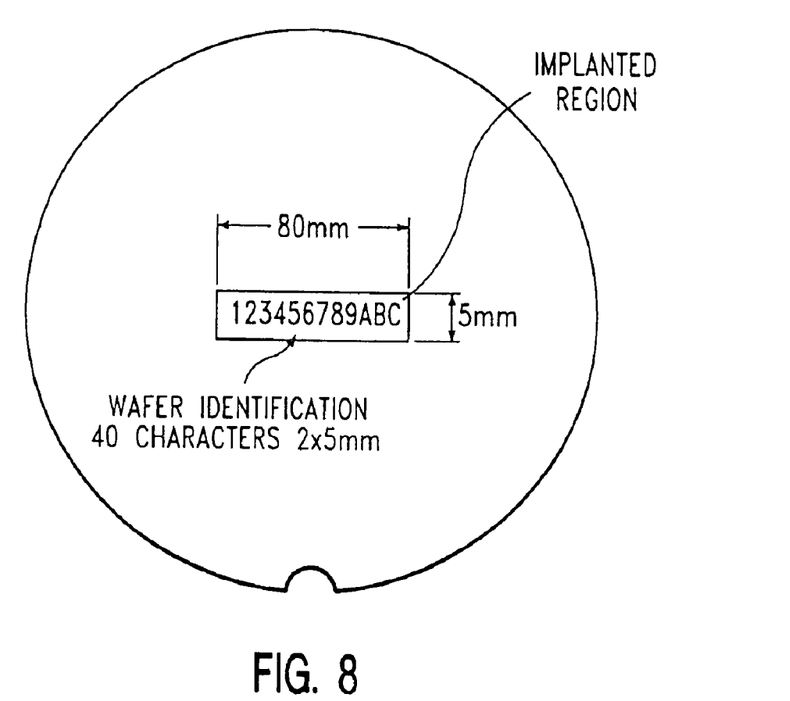
FIG. 8 represents an overhead view of another embodiment of pits for encoding information in a semiconductor wafer according to the present invention.

As illustrated in FIG. 8, pits may be formed in a certain predefined area of the semiconductor wafer. Typically, the pits according to this embodiment are formed in the backside of a wafer since active devices are typically formed in the front side of the wafer. In the embodiment illustrated in FIG. 8, pits are formed in an area about 80 mm long by about 5 mm high. Of course, pits may be formed in any region of any size on the front or backside of a wafer. For example, pits could be formed in an area on the front side of a wafer such as the perimeter. Alternatively, a portion of the front side of a semiconductor wafer that would normally be utilized for active devices may be sacrificed to make room for the pits. It is not necessary that the pits be formed in one specific region as in the embodiment illustrated in FIG. 8. The pits could be formed in other locations.

According to the embodiment illustrated in FIG. 8, pits may be formed in the shape of alphanumeric characters. However, it is not necessary that the pits are formed in groups that represent alphanumeric characters. They could be formed in groups that form other shapes.

The characters may be formed in any size. According to the embodiment illustrated in FIG. 8, characters are formed of pits wherein the characters each have dimensions of about 2 mm by about 5 mm. Typically, the characters have dimensions of about 0.2 mm by about 1.5 mm.

The characters may also be spaced apart any desirable distance. Typically, the characters are spaced a distance apart such that they may be easily read by the naked human eye. According to the embodiment illustrated in FIG. 8, the characters are spaced apart about 2 millimeters. Typically, the characters are spaced apart about 0.3 mm to about 0.6 mm.

Similar to the characters and the spacing between the characters, the pits making up the characters may be formed in different sizes, shapes, and depth, among other parameters. Typically, the pits are round, have a diameter of about 0.6 μm to about 1.0 μm and a depth of about 25 μm to about 100 μm and are spaced about 0.3 μm to about 0.6 μm from adjacent pits.

To facilitate detection of the pits, the pits are detectable due to a contrast with respect to surrounding surface regions of the semiconductor wafer. The contrast may be generated by carrying out a treatment on the semiconductor wafer. Alternatively, no additional treatment of the semiconductor wafer is necessary. For example, according to one embodiment, the contrast with the surrounding of the semiconductor wafer is simply provided by forming the pits of the sufficient depth to result in the appearance of the contrast as compared to surrounding regions of the semiconductor wafer.

According to another example, to facilitate detection of the pits, the region that the pits are formed in may first be implanted. The implanting can be done to effect various changes in the semiconductor wafer in the region that the pits are to be formed in. The ion implanting may change the index of refraction of the semiconductor wafer in this region. The implanting may provide the surface of the semiconductor wafer surrounding the pits with contrast compared to the pits. The contrast may be provided by an ion implant in the region that the pits are formed in. The implanting of the semiconductor wafer in a region where pits to be formed may be carried out regardless of where the pits are formed in a semiconductor wafer and how they are formed.

According to an embodiment where the region that pits are to be formed in is first implanted, the implanting may be carried out according to any suitable process parameters. According to one embodiment, the implant is carried out at 500 Kev at a dose of about $10^{13}$ to about $10^{14}$ ions/cm$^2$. Such implant may be carried out with phosphorus ions. Of course, any ions and any process parameters may be utilized and those of ordinary skill in the art would be able to determine implant species as well as implant parameters without undue experimentation.

Figure 9:
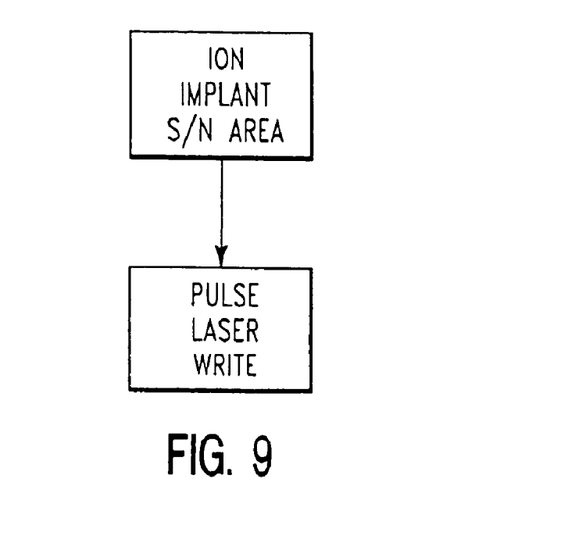
FIG. 9 represents a flow chart illustrating steps in a method for encoding information in a semiconductor wafer according to the present invention.

FIG. 9 illustrates a flow chart 4 for an embodiment of a method for fabricating an embodiment of a semiconductor wafer such as that illustrated in FIG. 8. As can be seen in FIG. 9, after ion implant, the pits may be formed. Pulse laser writing may form the pits. Any other suitable process may also be utilized to form pits. For example, one could utilize a chemical etch. Such an etch may not be particularly desirable since this would require extra processing steps to construct the masking levels.

Figure 10:
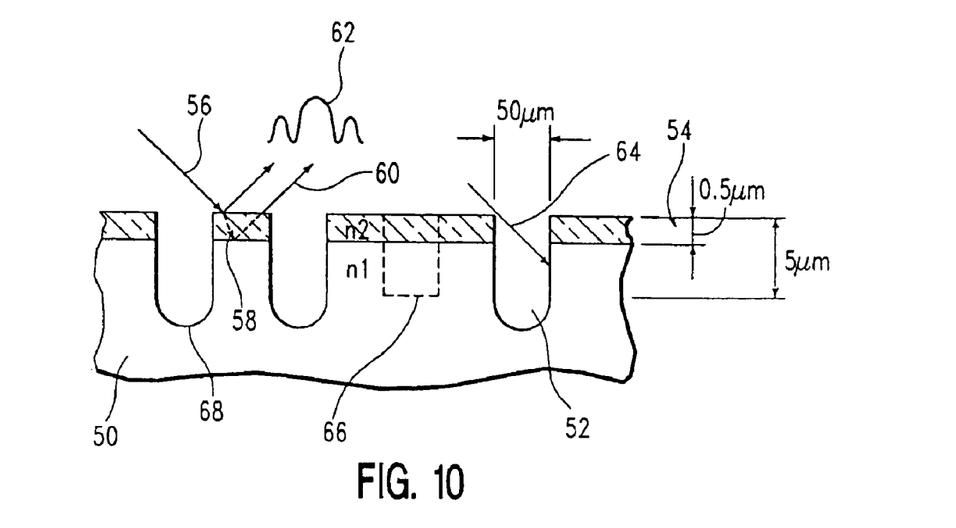
FIG. 10 represents a close-up cross-sectional view of an embodiment of a semiconductor wafer according to the present invention.

FIG. 10 provides a close-up partial cross-sectional view through three pits formed on a surface of a semiconductor wafer. The pits 52 formed in semiconductor wafer 50 are each about 50 μm wide.

The pits illustrated in FIG. 10 are formed to have straight sidewall portions about 5 μm deep. Each pit also includes a rounded bottom portion 68. Forming the pits about 5 μm deep is deep enough to stop subsequent processes from obscuring the pits. Of course, pits may be formed having a depth and diameter as well as having any configuration of sidewalls and bottom surfaces.

Approximately the top 5 μm 54 of semiconductor wafer 50 represent an area where the ion implant has been carried out. According to this embodiment, the ion implant changes the index of refraction of this top of about 0.5 μm on the surface. The change to the index of refraction is illustrated by incident radiation beam 56 and the refraction illustrated by beams 58. The radiation is then reflected by the non-implanted portion of the semiconductor wafer as illustrated by beams 60. FIG. 3 also provides a representation a waveform of the radiation 62.

On the other hand, as indicated by radiation beam 64, passing into a pit 52, such radiation will not be affected by the ion-implanted region of the semiconductor wafer and returned with interference fringes. Light striking a pit, as illustrated by waveform 62, will undergo some extinction and be returned with a minimum of interference fringes.

FIG. 10 also illustrates an empty space 66 where a pit could have been formed. By reason of this will be discussed in greater detail below.

Figure 12:
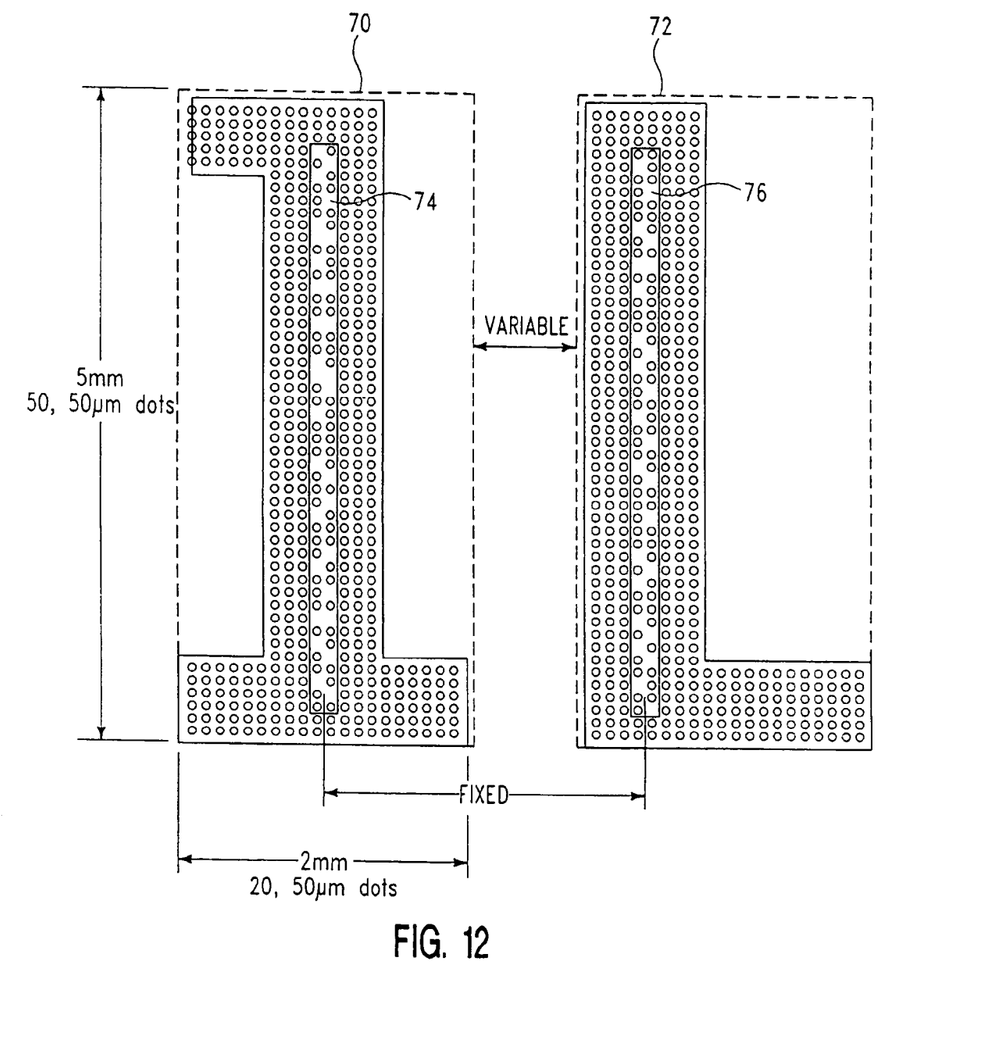
FIG. 12 represents a close-up view of another embodiment of the information encoding pits in a semiconductor wafer according to the present invention.

As illustrated in FIG. 12, pits may be formed in a semiconductor wafer in groups forming alphanumeric characters. FIG. 12 illustrates two characters. Each character is about 5 mm long by about 2 mm wide. Such characters would be about 50 dots having a length of about 50 µm by about 20 dots having a length of about 50 µm. Such characters would give a resolution of 2500 dots per inch (DPI). Such characters are more than large enough to make the characters readable by the naked eye.

Characters such as those illustrated in FIG. 12 can include a machine-readable portion. Along these lines, each character illustrated in FIG. 12 includes a machine-readable set of dots in a central section 74 and 76. Each machine-readable set of dots is two columns of 32 dots each.

A pit in such a machine-readable region represents a one in a binary system and a lack of a pit represents a zero. In such a case, two columns of 32 pits each would permit over 4 billion unique serial numbers if the same sequence were embedded in each character for redundancy. Alternatively, since 6 pit places may be included, in which case 26 or 64 unique characters may be represented so each character contains the same alphanumeric in human-readable or machine-readable form. According to such an embodiment, a few characters may be set aside for check sums. Also, the 6 dot places may be repeated several times for added redundancy.

Figure 11:
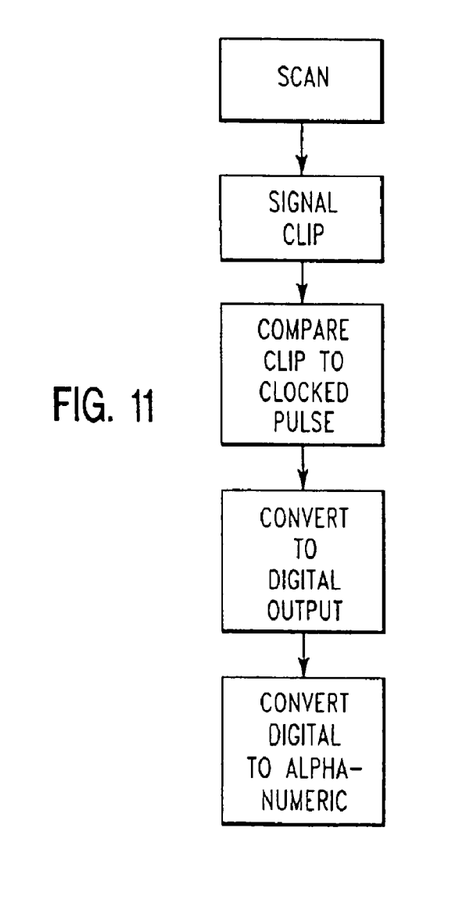
FIG. 11 represents a flow chart illustrating steps in an embodiment of reading information encoded in pits in a semiconductor wafer according to the present invention.

FIG. 11 represents a flow chart for a process for machine reading the machine-readable portions of the characters. According to such an embodiment, the characters are scanned until a signal from the inner machine-readable set of dots is picked up. This signal may be clipped, compared to a clocked pulse and converted to a digital output. The digital output is, in turn, converted to an analog alphanumeric output. Then, the machine-coded columns may be set on a repeating pitch and the human readable letter spacing permitted to vary for use of alignment of a laser reader.

According to another embodiment of the present invention, rather than forming pits in groups forming alphanumeric characters, the pits may be formed in a region on the front side and/or backside of a semiconductor wafer. The group of pits may be relatively small, especially as compared to the embodiment shown in FIG. 8. According to this embodiment, the group of pits typically is formed on the backside of a wafer. Similar to the pits in the embodiment illustrated in FIG. 8, a small group of pits typically is formed large enough, whether in diameter and/or depth to remain visible during subsequent processing. Also according to this embodiment, the pits typically digitally encode information and may be implemented at low cost, being readable by standard compact disc sensors and electronics without even requiring rotation of the semiconductor wafers.

Figure 13:
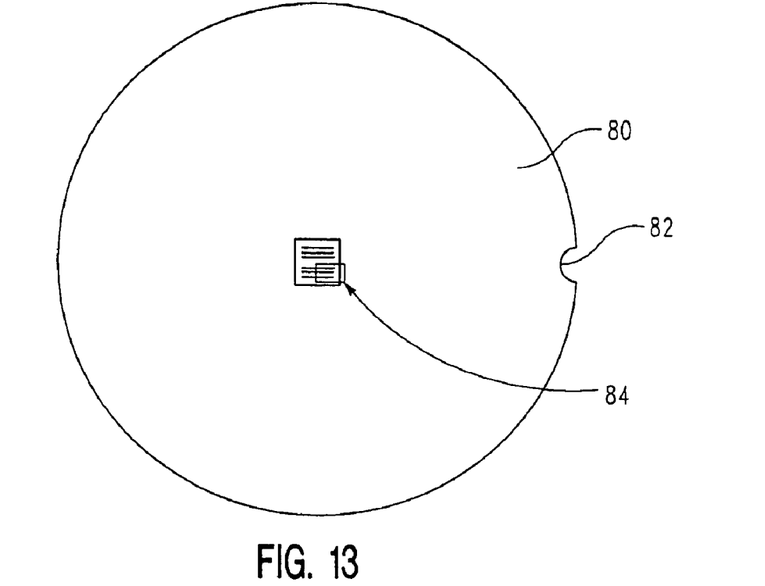
FIG. 13 represents an overhead view of another embodiment of a semiconductor wafer according to the present invention.

One example of such an embodiment is illustrated in FIG. 13. Along these lines, FIG. 13 shows a semiconductor wafer 80 having a locational notch 82 formed in an edge of the wafer. A group of pits has been formed in a region 84 in a center of the semiconductor wafer. Although the group of pits 82 and the wafer 80 illustrated in FIG. 13 is shown in the center of semiconductor wafer on the backside of the wafer, a group of pits may be formed in any location on either the front surface or the back surface of the wafer. Along these lines, according to this or any other embodiment, more than one group of pits may be formed on a semiconductor wafer. Furthermore, one semiconductor wafer could include more than one embodiment of pits such as those described herein.

A group of identification pits such as those illustrated in FIG. 13 could be formed in the top surface in a periphery of a semiconductor wafer without interfering active devices on the front surface of the wafer. However, the pits typically are formed on the backside of a wafer. While it is not necessarily important where a group of pits is formed, it is important that the location be known on the wafer, such as relative to the wafer edge or location notch 82.

Pits according to the embodiment illustrated in FIG. 13 may be formed in any desired arrangement. However, typically, the pits are arranged in lines rather than curved tracks to simplify the laser reader design.

Figure 14:
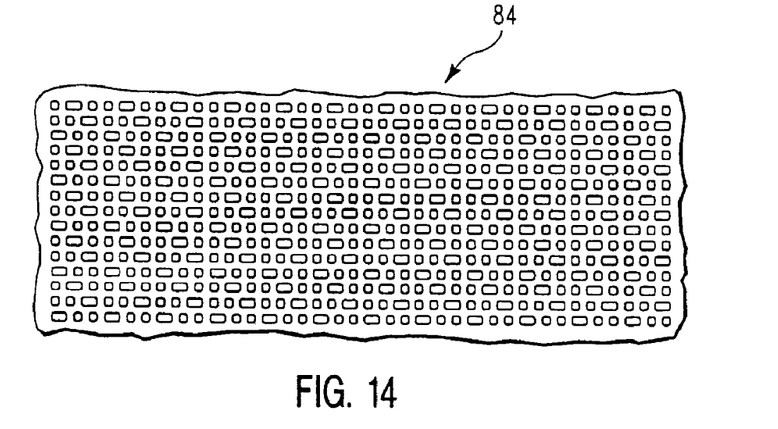
FIG. 14 represents a close-up view of pits in a semiconductor wafer according to the present invention.

FIG. 14 illustrates a close-up view of the region 84 including the pits. The pits illustrated in FIG. 14 include pits having various lengths. Along these lines, the pits illustrated in FIG. 14 have two different lengths. Also, the pits are formed in lines in the embodiment illustrated in FIG. 14.

Figure 15:
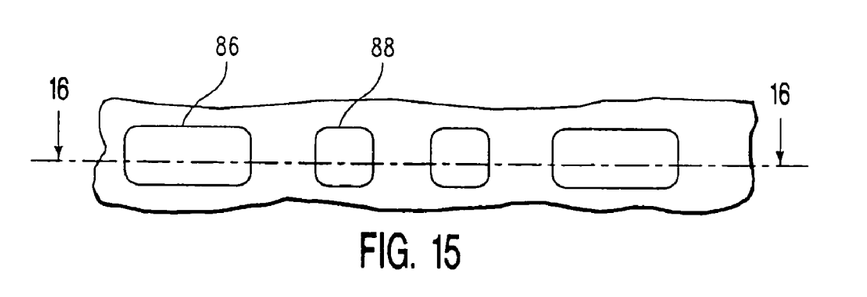
FIG. 15 represents a close-up view of a portion of the pits illustrated in FIG. 14.

FIG. 15 represents a close-up cross sectional view of a region of the group of pits illustrated in FIG. 14. Along these lines, FIG. 15 illustrates long pits 86 and short pits 88.

Figure 16:
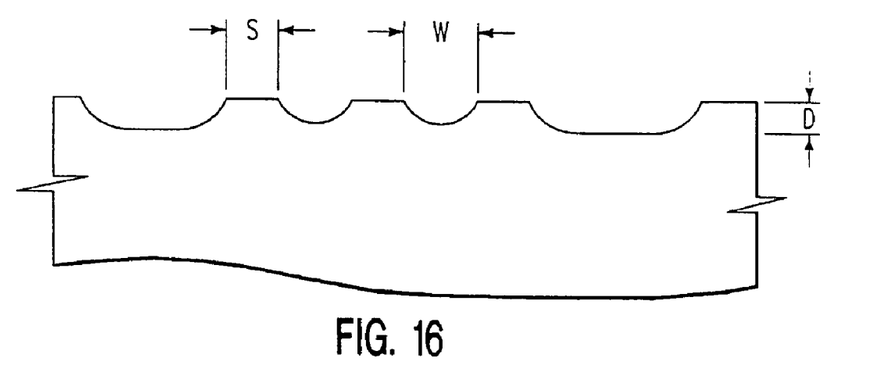
FIG. 16 represents a cross-sectional view of the embodiment of the pits illustrated in FIG. 15.

FIG. 16 represents a close-up cross-sectional view of the group of pits illustrated in FIG. 15 along the line 16 illustrated in FIG. 15. The pits illustrated in FIG. 16 have a width (W) of about 0.4 µm and a depth (D) of about 2 µm and are spaced apart a distance (S) of about 0.75 µm.

While pits according to the embodiment illustrated in FIGS. 13-16 may be formed at any depth, typically, the depth is sufficient to ensure that the pits remain readable during subsequent processing as well as to help ensure contrast with any treatment carried out on the backside of the wafer. Typically, the pits are formed at least 2.5 µm deep into a surface of a semiconductor wafer. In general, the pits may be about 1.5 µm to about 3 µm deep.

The spacing between adjacent pits and between adjacent rows of pits may also vary. Along these lines, adjacent pits typically are spaced about 0.5 µm to about 1 µm apart. On the other hand, adjacent rows of pits typically are spaced about 0.5 µm to about 2.0 µm apart.

According to such embodiment, the semiconductor wafer could also be ion implanted or another process carried out to improve contrast is in the embodiment illustrated in FIGS. 8, 10, and 12. Accordingly, the discussion above of the implanting and other processes is applicable and referred to here. The pits could also be formed of a depth sufficient to provide the contrast.

In the embodiment shown in FIGS. 13-16, if 50 µm were required to encode an alphanumeric character, 50 characters could be encoded in a line about 2.5 millimeters. Therefore, the embodiment illustrated in FIGS. 13-16 can make it easy to encode wafer serial numbers, substrate type, doping level, manufacture, among other pieces of information. Such data could be encoded in the pits utilizing a laser, ion milling, or mask and etch procedures.

Since so much data could be encoded, it would be possible to encode lot number, part number and routing information, among other pieces of information in a fabricator that each tool could read and display. To help read the information, it is typically important to know where the pits are formed relative to a wafer edge or notch as referred to above. In addition to encoding the information discussed above, tool recipe data could also be encoded in the pits. Each tool could have a specific line or group of lines assigned to it. This could eliminate the need to download recipes. Encoding tool recipe data could also help to ensure that every wafer received correct processing. Still further, data could be written back to the wafer to complete the data loop.

Figure 17:
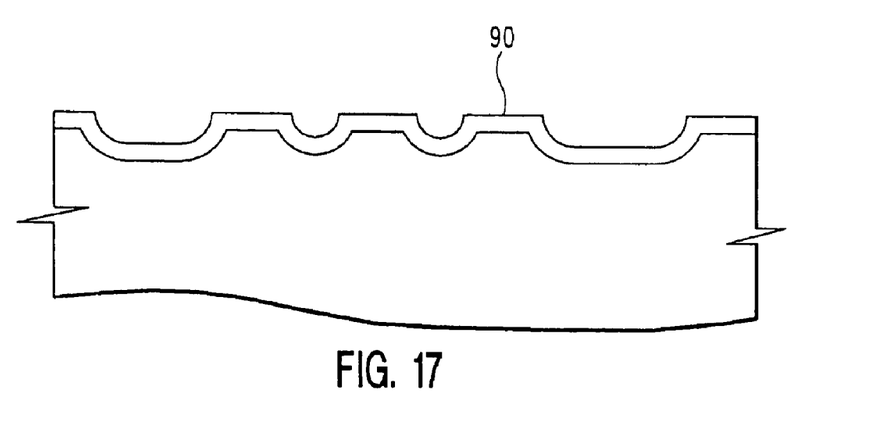
FIG. 17 represents a cross-sectional view of the pits illustrated in FIG. 16 including a coating on the pits and spaces adjacent the pits.

After encoding information in pits in a semiconductor wafer, the surface of a wafer in which the pits are formed could be coated with a coating 90 to protect the marks. Among the coatings that could be utilized according to such an embodiment are sapphire and/or silicon carbide. Only the portion of the wafer where the pits are formed need actually be coated. However, the entire side of a wafer may be coated. After coating, the marks would be in a read only form.

Figure 18:
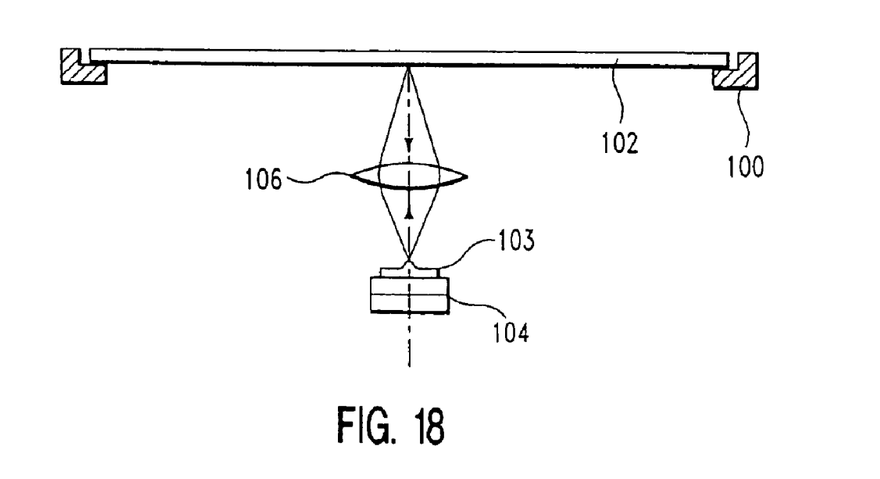
FIG. 18 represents a cross-sectional view of an embodiment of a system for reading information encoded in pits in a semiconductor wafer according to the present invention.

As referred to above, reading a group of pits such as those illustrated in FIGS. 13-16, could include utilizing a standard CD reader. FIG. 18 illustrates an embodiment of an apparatus for reading an embodiment of information encoding pits such as that illustrated in FIGS. 13-17. The apparatus illustrated in FIG. 18 includes a wafer holder 100 for supporting wafer 102 on which the pits have previously been formed. The wafer holder may be open on the underside of the wafer as illustrated in FIG. 18.

At least one sensor may be arranged on a side of semiconductor wafer 102 adjacent the side that the pits have been formed in. Typically, one sensor is movably mounted. Movably mounting the sensor can permit the position of the sensor to be altered relative to the pits to read all of the pits.

The embodiment illustrated in FIG. 18 includes a stage 104 movable in x and y directions parallel to the surface of the semiconductor wafer. The sensor is included in a reader 104. The reader illustrated in FIG. 18 also includes lens 106 for focusing the incident light beam on the back of the semiconductor wafer. The lens permits the reader to be kept at a distance from the wafer by changing the focal length of the focusing optics. The reader 103 produces a laser beam that it is directed toward to the semiconductor wafer and a sensor for receiving the laser light reflected back by the semiconductor wafer.

If the spatial relationship between the wafer, holder, and reader is known, the reader mechanism may remain simple. If the wafer is located based on a reference position notch such as notch 82 in the wafer illustrated in FIG. 13, then no theta stage motion may be required. A reader, such as a laser reader illustrated in FIG. 18, may simply scan the location of marks looking for codes that label the data that follows. Arrow correction and check sum corrections may be available to the system making the data read very reliable. Other mechanisms such as an x and tilt movement stages could also be utilized.

The foregoing description of the invention illustrates and describes the present invention. Additionally, the disclosure shows and describes only the preferred embodiments of the invention, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed as new and desired to be protected by Letters Patent of the United States is:

1. A semiconductor wafer, comprising:
   a plurality of pits in the semiconductor wafer, the pits being arranged in a digital information-providing pattern, said digital information-providing pattern being arranged and suitably adapted to be readable before, during and after completion of processing on the wafer, and further comprising a coating of either sapphire or silicon carbide.

2. The wafer according to claim 1, wherein said digital information-providing pattern is arranged in a pattern other than a bar code pattern.

3. The wafer according to claim 1, wherein the pits are arranged in a region of the wafer, wherein the contrast is provided by an ion implant in the region.

4. The wafer according to claim 3, wherein the ion implant is carried out to an implant depth and the pits have a pit depth greater than the implant depth.

5. The wafer according to claim 1, wherein the pits are arranged in a region of the wafer, wherein a detectable contrast is provided by a depth of the pits in the region.

6. The wafer according to claim 1, wherein the digital information providing-pattern comprises at least one of a binary pattern, a barcode pattern, and an alphanumeric pattern.

7. The wafer according to claim 1, wherein the digital pattern comprises long and short pits.

8. The wafer according to claim 1, wherein the plurality of pits comprise pits of a first shape and pits of a second shape.

9. The wafer according to claim 1, wherein the pits are on at least one surface of the wafer selected from the group consisting of a front surface, a back surface, and a side surface.

10. The wafer according to claim 1, wherein the pits are at least 2.5 µm deep.

11. The wafer according to claim 1, wherein the pits are on a side surface of the wafer extending from a front surface of the wafer to a back surface of the wafer.

12. The wafer according to claim 11, wherein the pits on the side surface of the wafer are formed prior to slicing the wafer from a boule by providing diagonal lines in the boule to provide a unique pattern on each wafer sliced from the boule.

13. The wafer according to claim 1, wherein the pits are readable by a reader's eye.

14. The wafer according to claim 1, wherein the pits are readable with a laser reading device.

15. The wafer according to claim 1, further comprising a coating on the surface of the pits.

16. The wafer according to claim 1, wherein the pits have a width of at most approximately 1 mm and a depth of at most approximately 1 mm.

17. The wafer according to claim 1, wherein a bottom surface of the pits is curved.

18. The wafer according to claim 1, wherein at least one of the pits is perpendicular to a top surface and a bottom surface of the wafer.

19. The wafer according to claim 1, wherein at least one of the pits is angled with respect to a line perpendicular to a top surface and a bottom surface of the wafer.

20. The wafer according to claim 1, wherein at least one of the pits has curved sidewalls.

21. The wafer according to claim 1, wherein the pits have at least two different widths.

22. The wafer according to claim 1, wherein the pits are machine-readable.

23. The wafer according to claim 1, wherein the pits are arranged in a back surface of the wafer.

24. The wafer according to claim 23, wherein groups of the pits have the shape of at least one of letters and numbers.

25. The wafer according to claim 24, wherein each group of pits has a width of approximately 2 mm and a height of approximately 5 mm.

26. The wafer according to claim 24, wherein adjacent groups of pits are separated from each other by a distance of approximately 2 mm.

27. The wafer according to claim 24, wherein each group of pits includes a machine-readable set of spaces for pits, each space comprising 2 columns each comprising 32 pits.

28. The wafer according to claim 1, wherein light striking spaces between the pits form interference fringes.

29. The wafer according to claim 1, wherein light striking the pits is not reflected.

30. The wafer according to claim 1, wherein light striking the pits is reflected with a phase change.

31. The wafer according to claim 1, wherein the pits comprise at least one location pit for providing a locational reference to a plurality of informational pits.

32. The wafer according to claim 31, wherein the location pit is arranged in a side edge of the wafer and the informational pits are located in a top surface or a bottom surface of the wafer.

33. The wafer according to claim 1, wherein the pits have the same widths and at least two different lengths.

34. The wafer according to claim 33, wherein the pits are arranged in at least one line.

35. The wafer according to claim 33, wherein adjacent pits in a line or in adjacent lines are separated by a distance of at least 5 μm.

36. The semiconductor wafer according to claim 1, wherein the plurality of pits are simultaneously arranged in both the digital information-providing pattern and a human-readable pattern.

37. The semiconductor wafer according to claim 1, wherein the digital information-providing pattern is a non-binary coded pattern, and the plurality of pits comprise pits having at least three different shapes.

38. The semiconductor wafer according to claim 1, wherein the digital information-providing pattern is a non-binary coded pattern, and the plurality of pits comprise a plurality of differently oriented oval pits as defined by an orientation of each of an associated major axis thereof.

39. The semiconductor wafer according to claim 38, wherein the non-binary coded pattern is a quaternary-coded pattern.

40. A method of encoding information on a semiconductor wafer, comprising:
  converting the information into a digital form; and
  forming pits suitable for being read before, during and after completion of processing on the wafer corresponding to the digital form of the information in the semiconductor wafer, and
  wherein pits previously formed are invalidated.

41. The method according to claim 40, wherein forming the pits comprises forming a line of pits having two different lengths, the line of pits corresponding to the digital form of the information.

42. The method according to claim 40, further comprising forming a reference point, such that the pits are located a predetermined distance from the reference point.

43. The method according to claim 40, wherein said digital form is a form other than a bar code pattern.

44. The method according to claim 40, wherein the pits are formed prior to cutting the wafer from a boule, and forming the pits comprises: forming a first, curved groove in the boule; forming at least one linear groove in the boule; and slicing the boule into wafers.

45. The method according to claim 40, further comprising: coating the pits with a coating.

46. The method according to claim 40, further comprising: reading the information represented by the pits.

47. The method according to claim 46, wherein the information is read with a machine.

48. The method according to claim 46, wherein the information is readable by an unaided human eye.

49. The method according to claim 40, wherein said pits are formed either before processing of the wafer begins, during wafer processing, or after wafer processing is completed.

50. The method according to claim 49, wherein said pits are formed during wafer processing to record information about the processing.

51. The method according to claim 49, wherein previously formed pits are altered.

52. The method according to claim 49, further comprising reading pits formed during processing and using the information read to determine a subsequent process parameter.

53. The method of claim 40, further comprising simultaneously arranging the pits to correspond both to the digital form and to a human-readable pattern.

54. The method of claim 40, wherein said step of forming pits includes forming pits having at least three different shapes.

55. The method of claim 40, wherein said converting the information into the digital form includes converting the information into a non-binary digital form, and said forming pits includes forming pits in a plurality of differently oriented oval pits as defined by an orientation of each of an associated major axis thereof.

56. The method of claim 40, further comprising scribing linear wafer sequence start notch along a longitudinal surface of a boule from which a plurality of semiconductor wafers are subsequently encoded and cut.

57. The method of claim 56, further comprising scribing a plurality of essentially helically-shaped boule sequence notches along the longitudinal surface.

58. The method of claim 40, further comprising scribing a plurality of essentially helically-shaped boule sequence notches along a longitudinal surface of a boule from which a plurality of semiconductor wafers are subsequently encoded and cut.

59. A method of encoding information on a semiconductor wafer, comprising:
  converting the information into a digital form; and forming pits readable before, during and after completion of processing on the wafer corresponding to the digital form of the information in the semiconductor wafer, wherein said step of forming pits includes forming pits in the shape of a circle, an oval, and a rectangle.

60. A semiconductor wafer, comprising: a plurality of pits in the semiconductor wafer, the pits being arranged in a digital information-providing pattern, said digital information-providing pattern being readable before, during and after completion of processing on the wafer, wherein the digital information-providing pattern is a non-binary coded pattern, and the plurality of pits comprise pits having at least three different shapes, and wherein the at least three different shapes include a circle, an oval, and a rectangle.

* * * * *